United States Patent
Iino et al.

(10) Patent No.: US 7,508,026 B2
(45) Date of Patent: Mar. 24, 2009

(54) NON-VOLATILE SEMICONDUCTOR MEMORY DEVICE HAVING A TWO-LAYER GATE ELECTRODE TRANSISTOR AND METHOD OF MANUFACTURING THE DEVICE

(75) Inventors: Naohisa Iino, Yokohama (JP); Fumitaka Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 28 days.

(21) Appl. No.: 11/263,916

(22) Filed: Nov. 2, 2005

(65) Prior Publication Data

US 2006/0278916 A1   Dec. 14, 2006

(30) Foreign Application Priority Data

Jun. 8, 2005   (JP)   ............................ 2005-168325

(51) Int. Cl.
*H01L 27/115* (2006.01)
(52) U.S. Cl. .............................. 257/317; 257/E27.103; 438/260
(58) Field of Classification Search ................. 257/317, 257/E29.3, E27.103; 438/260; 365/185.01, 365/184
See application file for complete search history.

(56) References Cited

U.S. PATENT DOCUMENTS

| | | | |
|---|---|---|---|
| 5,923,976 A | | 7/1999 | Kim |
| 6,468,862 B1* | | 10/2002 | Tseng ........................ 438/259 |
| 6,818,505 B2 | | 11/2004 | Tsuji |
| 6,878,985 B2 | | 4/2005 | Arai et al. |
| 2001/0015454 A1* | | 8/2001 | Lee et al. ...................... 257/315 |
| 2001/0019152 A1* | | 9/2001 | Meguro ........................ 257/317 |
| 2002/0063275 A1* | | 5/2002 | Chang .......................... 257/315 |
| 2005/0224862 A1* | | 10/2005 | Iino et al. ..................... 257/315 |
| 2006/0060913 A1* | | 3/2006 | Ozawa ......................... 257/317 |
| 2006/0278916 A1 | | 12/2006 | Iino et al. |

FOREIGN PATENT DOCUMENTS

| | | |
|---|---|---|
| JP | 9-186257 | 7/1997 |
| JP | 10-256399 | 9/1998 |
| JP | 2003-31702 | 1/2003 |

OTHER PUBLICATIONS

U.S. Appl. No. 11/263,916, filed Nov. 2, 2005, Iino et al.
U.S. Appl. No. 11/455,645, filed Jun. 20, 2006, Hatakeyama.
U.S. Appl. No. 11/616,522, filed Dec. 27, 2006, Arai et al.
U.S. Appl. No. 12/050,802, filed Mar. 18, 2008, Hatekeyama.

* cited by examiner

*Primary Examiner*—Douglas M Menz
*Assistant Examiner*—Steven J. Fulk
(74) *Attorney, Agent, or Firm*—Oblon, Spivak, McClelland, Maier & Neustadt, P.C.

(57) ABSTRACT

A non-volatile semiconductor memory device has a gate insulating film formed on a semiconductor substrate between isolation regions, a first gate electrode formed on the gate insulating film, an intergate insulating film formed on the first gate electrode, and a second gate electrode formed on the intergate insulating film. The first gate electrode has a first part positioned between isolation insulating films, a second part positioned on the first part and having a partial portion positioned on the isolation region, and a third part positioned on the second part. A width of the third part is set narrower than that of the second part.

10 Claims, 7 Drawing Sheets

NON-VOLATILE SEMICONDUCTOR MEMORY DEVICE HAVING A TWO-LAYER GATE ELECTRODE TRANSISTOR AND METHOD OF MANUFACTURING THE DEVICE

CROSS-REFERENCE TO RELATED APPLICATIONS

This application is based upon and claims the benefit of priority from prior Japanese Patent Application No. 2005-168325, filed Jun. 8, 2005, the entire contents of which are incorporated herein by reference.

BACKGROUND OF THE INVENTION

1. Field of the Invention

The present invention relates to a non-volatile semiconductor memory device having a two-layer gate electrode transistor stacked with floating and control gate electrodes. Moreover, the present invention relates to a method of manufacturing the foregoing same device.

2. Description of the Related Art

A NAND flash EEPROM has been known as a non-volatile semiconductor memory device having a two-layer gate electrode transistor. The NAND flash EEPROM includes a shallow trench isolation (STI), a gate insulating film, a two-layer gate electrode, and a source/drain region. The shallow trench isolation (STI) functions as several element isolation regions formed in a substrate. The gate insulating film is formed on the substrate across STIs. The two-layer gate electrode is composed of a floating gate electrode, an intergate insulating film and control gate electrode, which are successively stacked on the gate insulating film. The source/drain region is positioned on both sides of the two-layer gate electrode, and formed in the substrate. The upper surface (thickness) of the STI is formed thicker than the surface of the gate insulating film, and set to approximately half of the height of the floating gate electrode. The control gate electrode on several floating gate electrodes is continued to form a word line. The floating gate electrode along the word line has a sectional structure such as a rectangular shape having a height longer than the base side. In other words, the upper surface of the floating gate electrode is set thicker (higher) than that of the STI. The gate insulating film is formed on both sidewalls of the floating gate electrode and the upper surface thereof, and on the STI.

The coupling capacitance of the two-layer gate electrode having the foregoing structure is as follows. Specifically, the capacitance of the gate insulating film below the floating gate electrode is set as Ctox, and the integrate capacitance is set as Cip. In this case, a coupling capacitance Cr is expressed using the following equation.

$Cr=Cip/(Cip+Ctox)$

Namely, the area of the intergate insulating film existing between floating and control gate electrodes gives an influence to the coupling capacitance.

According to the structure of the foregoing two-layer gate electrode, a contact area of the floating gate electrode and the intergate insulating film is increased, thereby increasing the coupling capacitance. There exists a method of increasing the contact area. According to the method, the film thickness of the floating gate electrode is formed thicker, thereby increasing the area of the intergate insulating film.

However, the foregoing method has the following problems. Specifically, in order to form a gate electrode, materials for the floating gate electrode, intergate insulating film, control gate electrode and mask are successively stacked. The control gate electrode material is etched until etching reaches the intergate insulating film using the mask material as a mask to form a control gate electrode. Thereafter, the intergate insulating film is etched using the mask material and the control gate electrode as a mask under the condition of selectivity lower than the floating gate electrode material. However, if the intergate insulating film is etched under the foregoing condition, the floating gate electrode material is etched likewise. In other words, if the floating gate electrode is formed thicker to improve a coupling ratio, the intergate insulating film formed at the sidewall of the floating gate electrode is formed higher. For this reason, it is difficult to secure a process margin for fully removing the intergate insulating film on the sidewall of the floating gate electrode and for securing the thickness of the floating gate electrode.

Moreover, the following problem arises if the intergate insulating film remains on the sidewall of the floating gate electrode. When etching the floating gate electrode material using the mask material and the control gate electrode as a mask after that, the floating gate electrode material is not fully etched. For this reason, there is the following possibility. That is, floating gate electrodes neighboring in the direction perpendicular to an extended line of the control gate electrode mutually short-circuit.

In order to improve the selectivity of the floating gate electrode material and the intergate insulating film, a dedicated chamber for a high selectivity gas is required. In addition, etching stop by reactive products must be avoided; for this reason, high process control is required.

On the other hand, the following method is given as another method of increasing the contact area of the floating gate electrode and the intergate insulating film. According to the method, the sectional structure of the floating gate electrode is varied (e.g., JPN. PAT. APPLN. KOKAI Publication No. 09-186257 and No. 2003-31702). In FIG. 6 of the foregoing Publication No. 09-186257, there is disclosed a converse T-shaped floating gate electrode. However, according to the invention disclosed in Publication No. 09-186257, the height of the protrusion is adjusted to increase a coupling capacitance. Therefore, process control of the intergate insulating film is not taken into consideration. The foregoing Publication No. 2003-31702 discloses the following non-volatile semiconductor memory device. The non-volatile semiconductor memory device has a three-layer floating gate electrode comprising first to third floating gate electrodes to increase an overlapping area of control and floating gate electrodes. However, Publication No. 2003-31702 has no consideration relevant to process control of the intergate insulating film. Consequently, it is desirable to develop a non-volatile semiconductor memory device, which can prevent reduction of a coupling capacitance, and securely remove an intergate insulating film, and a method of manufacturing the same.

BRIEF SUMMARY OF THE INVENTION

According to a first aspect of the present invention, there is provided a non-volatile semiconductor memory device comprising: an isolation region formed in a semiconductor substrate, and composed of several trenches and an isolation insulating film formed in the trench and having an upper surface set higher than the surface of the semiconductor substrate; a gate insulating film formed on the semiconductor substrate between the isolation regions; a first gate electrode formed on the gate insulating film; an intergate insulating film formed on the first gate electrode; and a second gate electrode formed on the intergate insulating film, the first gate electrode having: a first part positioned between the isolation insulating films; a second part positioned on the first part and having a partial portion positioned on the isolation region; and a third part positioned on the second part, a width of the third part being set narrower than that of the second part.

According to a second aspect of the present invention, there is provided a method of manufacturing a non-volatile semiconductor memory device comprising: successively forming a gate insulating film, a first conductive film and a first insulating film on a semiconductor substrate; forming several trenches in the first insulating film, the gate insulating film and semiconductor substrate using the first insulating film as a mask with predetermined intervals; forming a second insulating film functioning as an isolation region in said several trenches; removing the first insulating film between the second insulating film to form a first opening above the first conductive film; widening the width of the first opening wider than a first conductive film having a first width to form a second opening having a second width; forming a second conductive film in the second opening; etching back the second conductive film to set the thickness of the second conductive film to be substantially equal to a first thickness; forming a third insulating film on the entire surface; partly removing the third insulating film so that the third insulating film remains on a sidewall of the second opening, and forming a third opening having a third width on the second conductive film; forming a third conductive film in the third opening; setting a thickness of the third conductive film to a second thickness; and removing the third insulating film while removing the second insulating film until at least a side of the second conductive film is exposed.

DETAILED DESCRIPTION OF THE INVENTION

An embodiment of the present invention will be described below with reference to the accompanying drawings.

Figure 1:
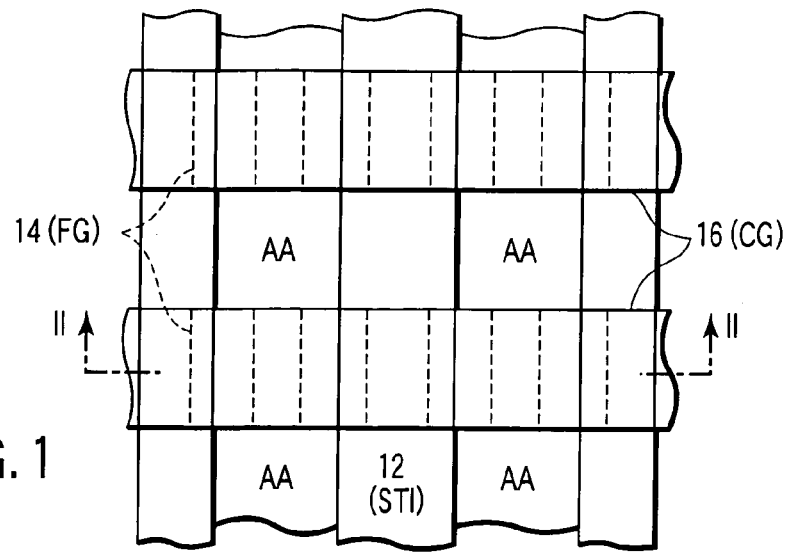
FIG. 1 is a top plan view showing a non-volatile semiconductor memory device according to a first embodiment of the present invention.
Figure 2:
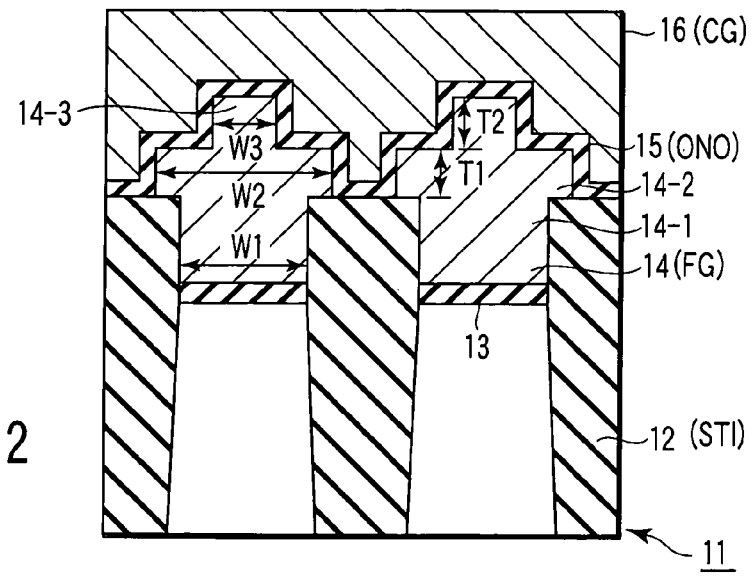
FIG. 2 is a cross-sectional view taken along a line II-II of FIG. 1.

FIG. 1 and FIG. 2 show a NAND flash EEPROM according to the embodiment. As seen from FIG. 1 and FIG. 2, several shallow trench isolations (STI) 12 are formed in a stripe from, with predetermined intervals in a semiconductor substrate 11. The upper surface of the STI 12 is set higher than the surface of the semiconductor substrate 11. In an active area (AA) functioning as an element region between STIs 12, the surface of the semiconductor substrate 11 is formed with a gate insulating film 13. A floating gate electrode (FG) 14 is formed on the gate insulating film 13. An integrate insulating film 15 is formed on the upper surface of the foregoing floating gate electrode 14 and STI 12. A control gate electrode (CG) 16 is further formed on the intergate insulating film 15. The control gate electrode 16 is arranged in the direction perpendicular to the STI 12, and shared with several floating gate electrodes 14 arranged along the control gate electrode 16, thereby forming a word line. In the element region positioning between STIs 12, both sides of the floating gate electrode 14 are formed with a source/drain region.

The floating gate electrode 14 has first to third parts 14-1 to 14-3. The first part 14-1 is located on the gate insulating film 13 and between STIs 12. The second part 14-2 is positioned on the first part 14-1, i.e., both sides in the longitudinal direction of the control gate electrode 16 positioned on the upper surface of the STI 12. The second parts 14-2 of the floating gate electrode 14 neighboring the control gate electrode direction are mutually separated with a predetermined interval. The third part 14-3 positions on the second part 14-2 and at the approximately center the second part 14-2. As seen from FIG. 2, the floating gate electrode has a cross shape in its section.

The relationship between parameters given below is expressed using the following equations (1) to (3). The parameters are the width W1 of the first part 14-1 of the floating gate electrode 14, width W2 of the second part 14-2, width W3 of the third part 14-3, thickness T1 of the second part, thickness T2 of the third part, and thickness Tip of the intergate insulating film 15.

$$W2 > W3 + 2Tip \quad (1)$$

$$W2 > W1 \quad (2)$$

$$T1 \approx T2 \quad (3)$$

As seen from the equation (1), the width W2 of the second part 14-2 is made larger than the combined widths of width W3, of the third part 14-3, and the double thickness, Tip, of the intergate insulating film 15. By doing so, a step is formed between the second and third parts 14-2 and 14-3. Moreover, the thicknesses T1 and T2 of second and third parts 14-2 and 14-3 are made approximately equal. By doing so, second and third parts 14-2 and 14-3 having the thickness T1 and T2 are formed thinner than the floating gate electrode formed with no step.

Figure 3:
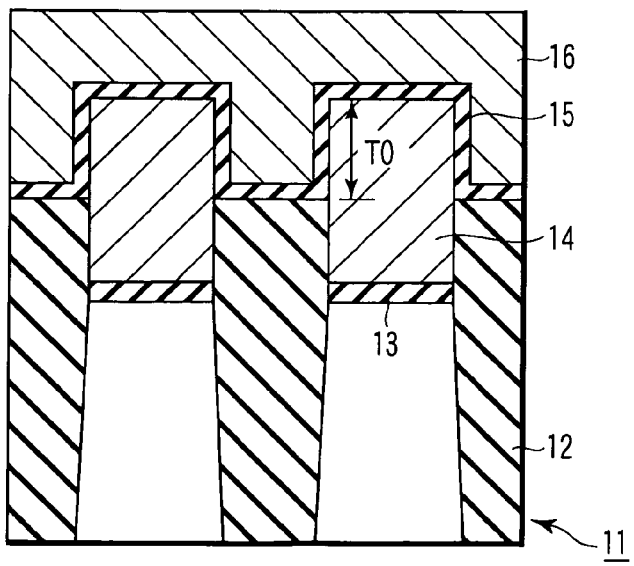
FIG. 3 is a cross-sectional view showing a conventional two-layer gate electrode structure.

FIG. 3 shows a conventional NAND flash EEPROM. In FIG. 3, the same reference numerals are used to designate the portions identical to FIG. 2. If the floating gate electrode 14 is not formed with a step as illustrated in FIG. 3, the floating gate electrode 14 has the following structure. Specifically, the thickness T0 of a part projecting from the upper surface portion is thicker than each thickness T1 and T2 of second and third parts 14-2 and 14-3 (T0>T1≈T2) As described above, if the thickness T0 of the floating gate electrode 14 is thicker, the following problem arises. When etching the gate intergate insulating film 15, it is difficult to fully remove the gate intergate insulating film 15 on the STI 12 under the sidewall of the floating gate electrode 14. For this reason, in etching after that, the floating gate electrode 14 is not sufficiently etched due to the remaining intergate insulating film 15. Thus, the floating gate electrode material remains between neighboring floating gate electrodes 14 in the direction perpendicular to the extended direction of the control gate electrode 16. As a result, these floating gate electrodes 14 mutually short-circuit.

On the contrary, the width and thickness of the second and third parts 14-2 and 14-3 of the floating gate electrode 14 are set as shown in the equations (1) to (3). By doing so, thicknesses T1 and T2 of second and third parts 14-2 and 14-3 are made smaller than the thickness of T0 of the conventional floating gate electrode 14. This serves to prevent the intergate insulating film 15 from remaining on the sidewall of the second and third parts 14-2 and 14-3 in etching the intergate insulating film 15. Therefore, the floating gate electrode 14 is sufficiently etched. Thus, neighboring floating gate electrodes 14 in the direction perpendicular to the control gate electrode 16 can be prevented from short-circuiting.

The case of T1=T2 is given as the optimum dimension to readily process the intergate insulating film 15. In this case, the minimum thickness is given in the height direction of the intergate insulating film 15 formed on the sidewall of the floating gate electrode 14. Even if T1>T2 or T1<T2, the total thickness of T1+T2 is equal, and thereby, the coupling ratio is unchanged.

Moreover, even if the step given by the second and third parts 14-2 and 14-3 is formed, the total thickness of those (i.e., T1+T2) is set to become equal to the thickness T0 of the conventional floating gate electrode. By doing so, the same coupling capacitance as the conventional case is obtained. Therefore, gate processing is simplified without reducing the coupling capacitance.

The relation of W2<W1 is given, and thereby, the following advantage is obtained even if the intergate insulating film 15 on the sidewall of the second part 14-2 remains on the STI 12. Namely, so long as the intergate insulating film 15 is formed on the STI 12, no floating gate electrode exists below the intergate insulating film 15. Therefore, it is possible to prevent short-circuits between neighboring floating gate electrodes.

Moreover, the relation of W2>W1>W3 is given in the width between the first to third parts 14-1 to 14-3, the sectional area of the third part 14-3 is reduced. This serves to reduce a coupling capacitance between neighboring cells in the direction perpendicular to the control gate electrode 16. Therefore, it is possible to prevent variations of write threshold voltage caused by neighboring cells.

The relation between thickness T1 and T2 is set as follows, and thereby, the following advantage is obtained. Specifically, the relation of T1<T2 is given, and thereby, a capacitance between neighboring cells is reduced. On the other hand, the relation of T1>T2 is given, and thereby, gate processing is simplified. In addition, even if the intergate insulating film 15 remains, short-circuits between neighboring floating gate electrodes are prevented so long as the film 15 remains on the STI 12.

The following is an explanation about the method of manufacturing the non-volatile semiconductor memory device having the foregoing structure. FIG. 4 to FIG. 16 shows the manufacturing process.

Figure 4:
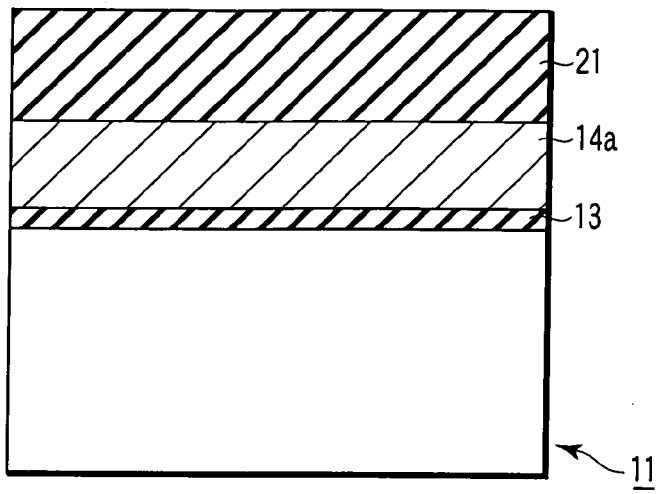
FIG. 4 is a cross-sectional view to explain the method of manufacturing the structure shown in FIG. 2.

As shown in FIG. 4, gate insulating film 13, floating gate electrode material 14a (e.g., polysilicon), and mask material 21 (e.g., silicon nitride film) are successively formed on a semiconductor substrate 11.

Figure 5:
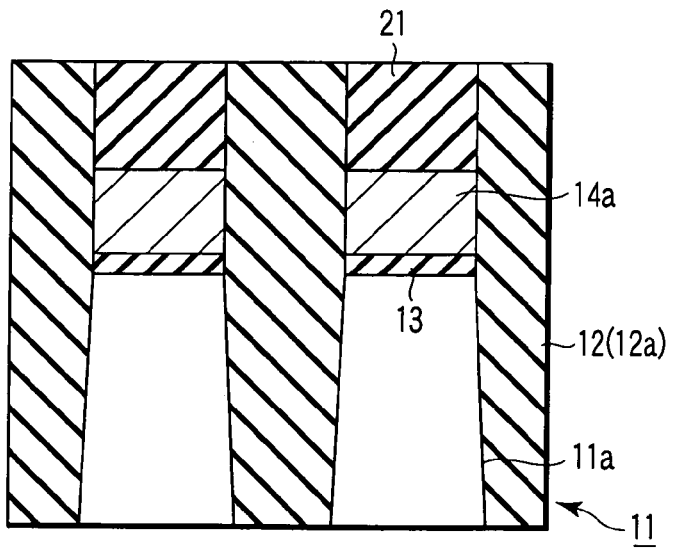
FIG. 5 is a cross-sectional view to explain the manufacturing process following FIG. 4.

Thereafter, as shown in FIG. 5, the mask material 21, floating gate electrode material 14a gate insulating film 13, and semiconductor substrate 11 are formed with several trenches 11a via a photolithography process (not shown). The trench 11a is filled with a silicon oxide film 12a to form an STI 12 functioning as an isolation region. The interval between STIs 12 is set equal to the width W1 of the first part 14-1 of the floating gate electrode 14.

Figure 6:
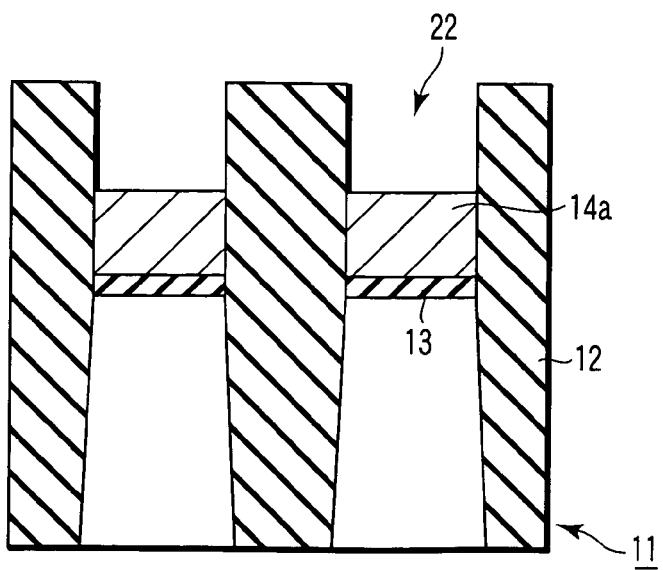
FIG. 6 is a cross-sectional view to explain the manufacturing process following FIG. 5.

As shown in FIG. 6, the mask material 21 is removed using reactive ion etching (RIE), and thereby, an opening 22 is formed to expose the floating gate electrode material 14a.

Figure 7:
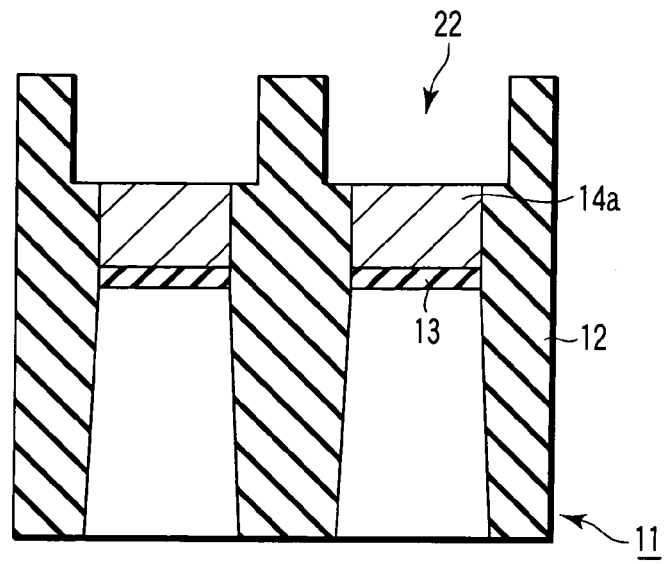
FIG. 7 is a cross-sectional view to explain the manufacturing process following FIG. 6.

As shown in FIG. 7, the upper portion of the STI 12 is etched using isotropic etching such as wet etching to widen the width of the opening 22, that is, the width between STIs 12. The widened width of the opening 22 is equal to the width W2 of the second part 14-2 of the floating gate electrode 14.

Figure 8:
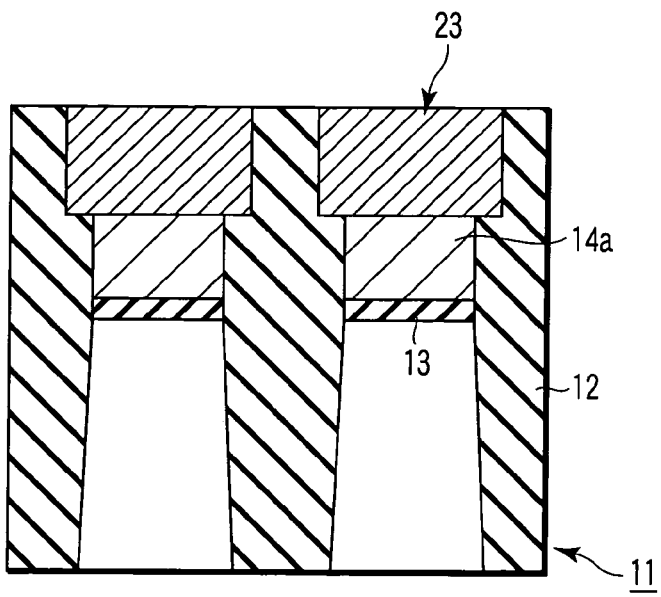
FIG. 8 is a cross-sectional view to explain the manufacturing process following FIG. 7.

Thereafter, as shown in FIG. 8, a polysilicon layer 23 is formed in the opening 22 using a damascene process. Specifically, the polysilicon layer 23 is deposited on the entire surface. Then, the polysilicon layer 23 is planarized by chemical mechanical polishing (CMP) using the STI 12 as a stopper.

Figure 9:
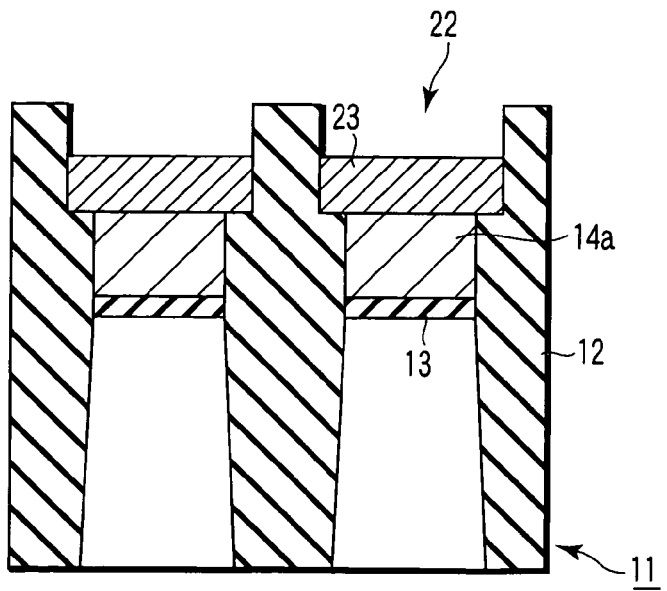
FIG. 9 is a cross-sectional view to explain the manufacturing process following FIG. 8.

As shown in FIG. 9, the polysilicon layer 23 is etched back using RIE, for example. The polysilicon layer 23 corresponds to the second part 14-2 of the floating gate electrode 14, and its thickness is equivalent to T1.

Figure 10:
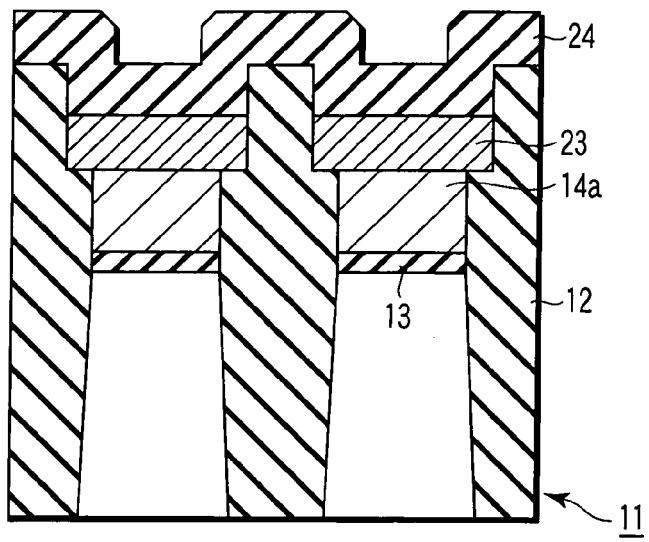
FIG. 10 is a cross-sectional view to explain the manufacturing process following FIG. 9.

Thereafter, as shown in FIG. 10, a silicon oxide film 24 is formed on the entire surface as a mask material using TEOS. The thickness of the silicon oxide film 24 is set to half of a value subtracting the width W3 of the third part 14-3 from the width W2 of the second part 14-2 of the floating gate electrode, that is, (W2-W3)/2.

Figure 11:
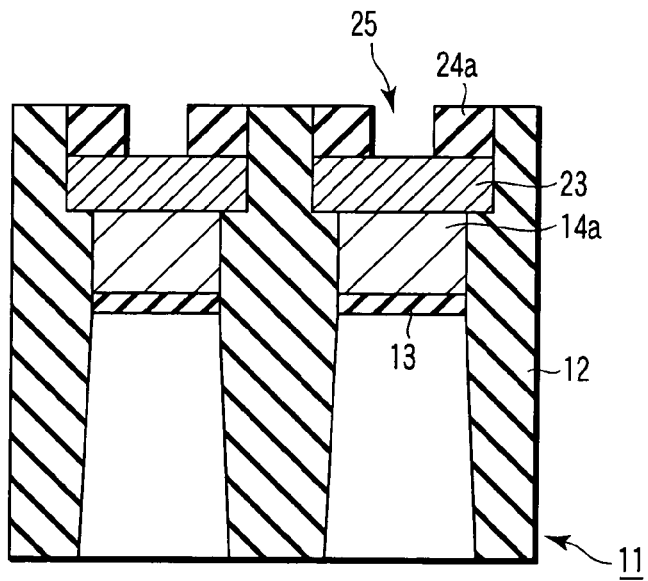
FIG. 11 is a cross-sectional view to explain the manufacturing process following FIG. 10.

As shown in FIG. 11, sidewall 24a and opening 25 are formed in the opening 22. Specifically, the silicon oxide film 24 is etched using RIE to form the opening 25 for exposing the polysilicon layer 23. Simultaneously, the sidewall 24a contacting with the STI 12 is formed using the remaining silicon oxide film 24.

Figure 12:
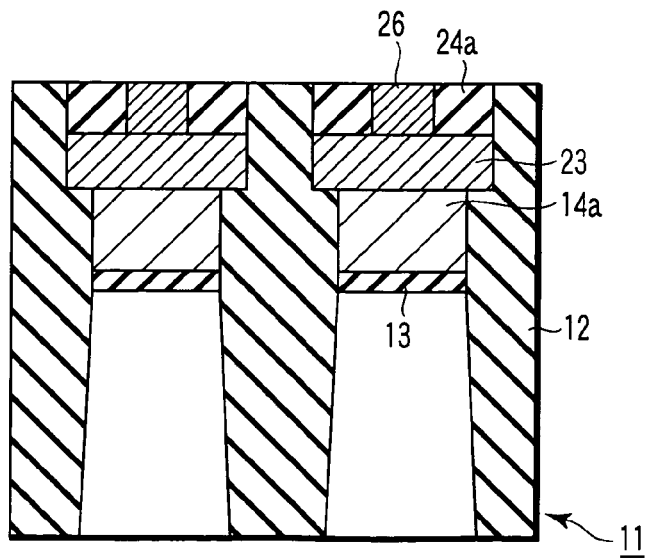
FIG. 12 is a cross-sectional view to explain the manufacturing process following FIG. 11.

Thereafter, as shown in FIG. 12, the opening 25 is filled with a polysilicon layer 26 using a damascene process. Specifically, the polysilicon layer 26 is deposited on the entire surface, and then, the polysilicon layer 26, sidewall 24a and STI 12 are planarized by CMP. Planarizing is carried out until the thickness of the polysilicon layer 26 becomes equal to the second thickness T2 (≈T1)

Figure 13:
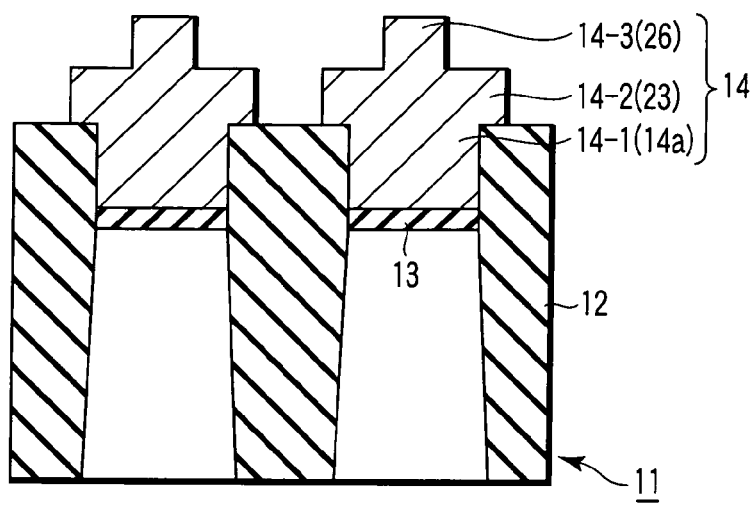
FIG. 13 is a cross-sectional view to explain the manufacturing process following FIG. 12.

As shown in FIG. 13, the polysilicon layer is etched under the condition of the selectivity larger than the silicon oxide film. In this case, etching is carried out to remove the sidewall 24a while removing the STI 12 until reaching the boundary of second and first parts 14-2 and 14-1. In the manner described above, the floating gate electrode having first to third parts 14-1 to 14-3 is formed.

Figure 14:
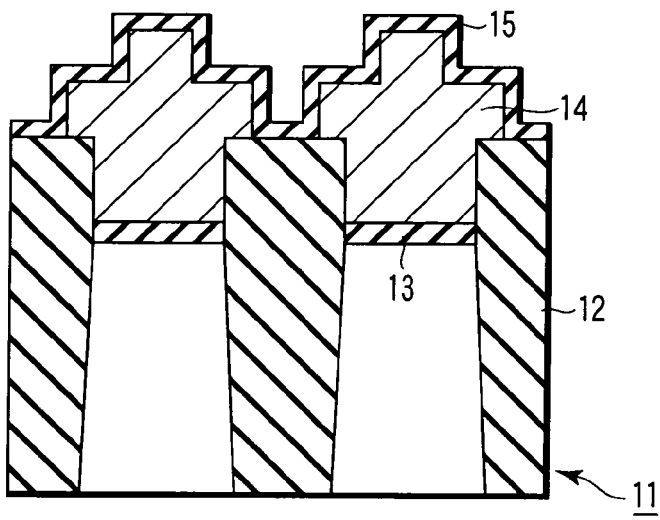
FIG. 14 is a cross-sectional view to explain the manufacturing process following FIG. 13.
Figure 15:
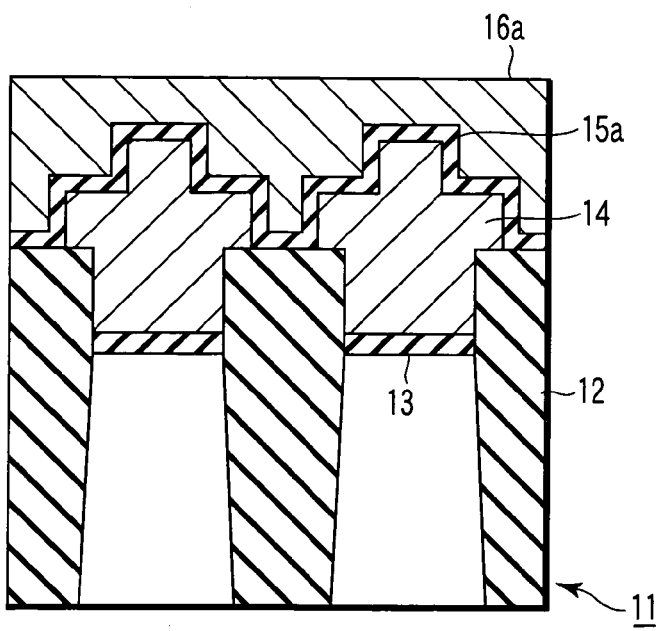
FIG. 15 is a cross-sectional view to explain the manufacturing process following FIG. 14.
Figure 16:
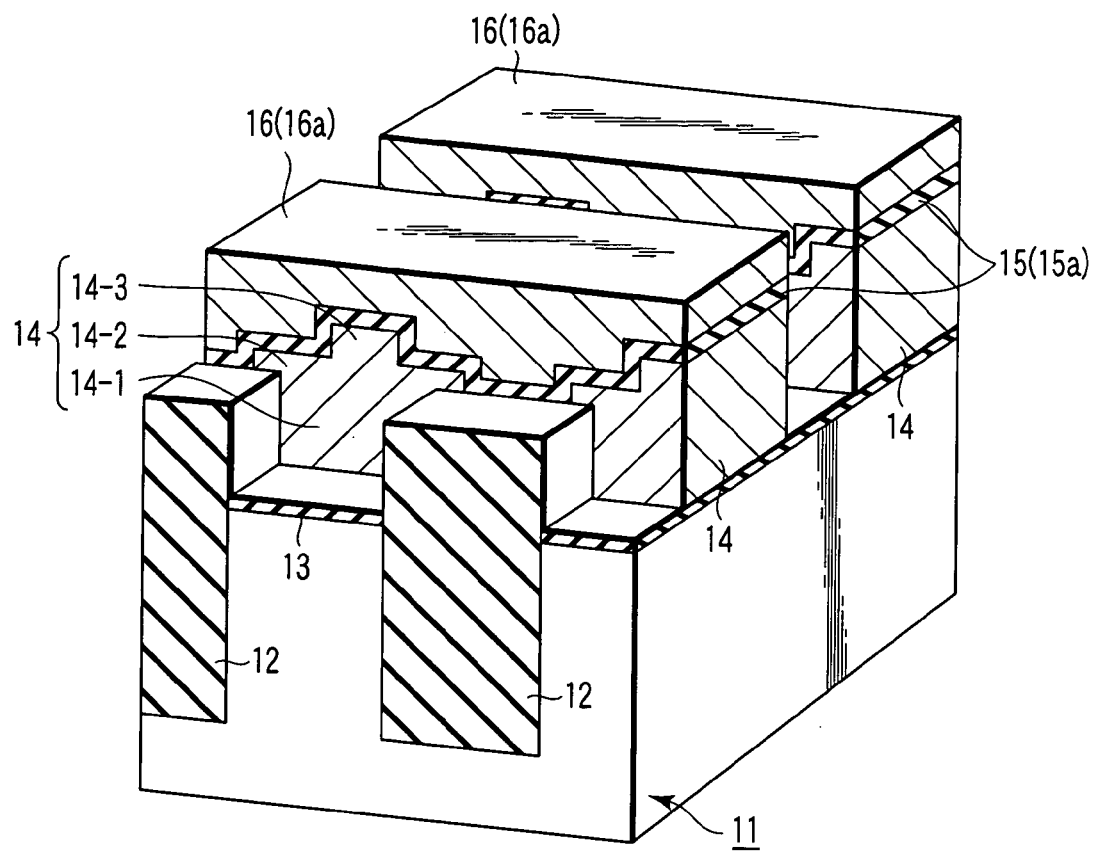
FIG. 16 is a cross-sectional view to explain the manufacturing process following FIG. 15.

Thereafter, as shown in FIG. 14, an ONO film 15a functioning as the intergate insulating film 15 is formed on the entire surface. As shown in FIG. 15, a polysilicon layer 16a is formed on the entire surface.

The polysilicon layer 16a, ONO film 15a and floating gate electrode 14 are successively etched using several mask materials (not shown) formed in the direction perpendicular to the STI 12. Specifically, the polysilicon film 16a is etched until reaching the intergate insulating film 15. Thereafter, the ONO film 15a is etched under the condition that the selectivity of the ONO film 15a is larger than the polysilicon layer of the floating gate electrode 14. In this case, the thickness of second and third parts 14-2 and 14-3 of the floating gate electrode 14 is set to nearly equal to each other. Thus, the ONO film 15a formed on each sidewall of the second and third parts 14-2 and 14-3 is removed at approximately the same time. Therefore, the ONO film 15a is prevented from remaining on the sidewall of the floating gate electrode 14. Then, the polysilicon layer of the floating gate electrode 14 is etched under the condition that the selectivity of the polysilicon layer is larger than the silicon oxide film. By doing so, the floating gate electrode 14 is formed. In the manner described above, it is possible to form a two-layer gate electrode comprising control gate electrode 16, intergate insulating film 15 and floating gate electrode 14 having a step.

Thereafter, impurity ions are implanted into the semiconductor substrate positioned on both sides of the two-layer gate electrode to form a source/drain region (not shown).

According to the foregoing embodiment, the floating gate electrode 14 has the following structure. Specifically, the floating gate electrode 14 is composed of first to third parts 14-1 to 14-3. The first part 14-1 is positioned between STIs 12. The second part 14-2 is positioned on the first part 14-1, and has both sides positioned on the STI 12. The third part 14-3 is positioned at the-approximately center of the second part 14-2. Even if the total thickness of the floating gate electrode 14 is set equal to that of the conventional floating gate electrode, the following advantage is obtained. Specifically, the vertical thickness (height) of the ONO film 15a formed at each sidewall of second and third parts 14-2 and 14-3 is made smaller than the conventional thickness. Therefore, the intergate insulating film 15 on the floating gate electrode 14 is securely removed without reducing a coupling capacitance. Thus, it is possible to prevent short-circuits with floating gate electrodes neighboring in the direction perpendicular to the extended direction of the control gate electrode 16.

According to the foregoing embodiment, the second part 14-2 is formed in the widened opening of the floating gate electrode 14. Thereafter, sidewall 24a and opening 25 are formed in the opening 22 via deposition and etching processes, and then, the third part 14-3 is formed in the opening 25. Thus, the third part 14-3 is formed in self-alignment without using lithography process. Therefore, the number of manufacturing processes is reduced, and an approximately cross-shaped floating gate electrode is formed.

In addition, the first to third parts 14-1 to 14-3 are formed symmetrically. Therefore, in the floating gate electrode having a step, a coupling capacitance between neighboring cells is uniformly given, and memory cell characteristic is equalized.

Figure 17:
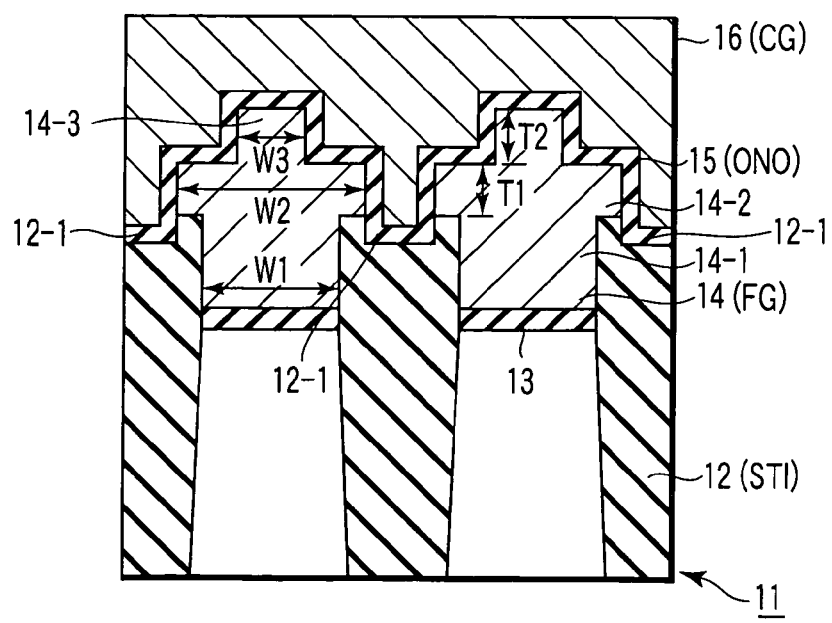
FIG. 17 is a cross-sectional view showing a first modification example of the embodiment.
Figure 18:
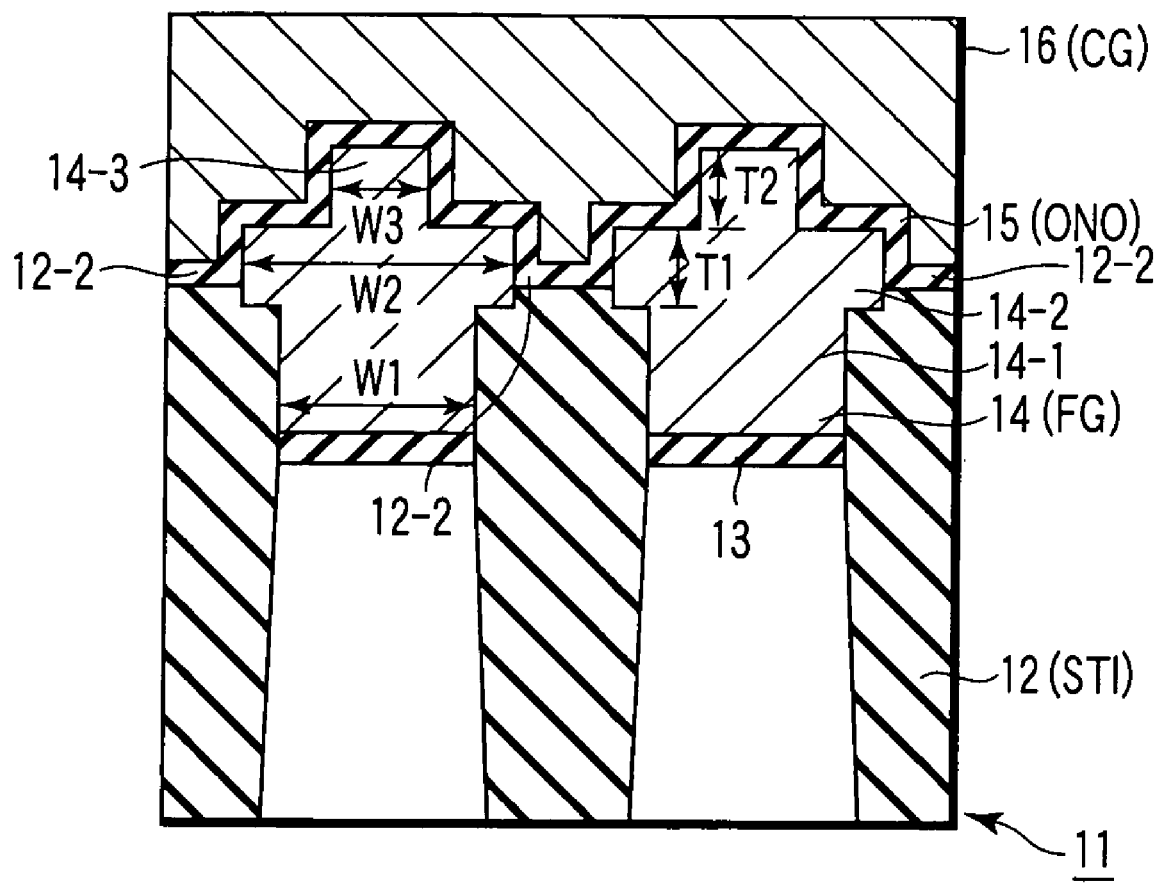
FIG. 18 is a cross-sectional view showing a second modification example of the embodiment.

The present invention is not limited to the foregoing embodiment. FIG. 17 and FIG. 18 show first and second modification examples, respectively.

According to the first modification example shown in FIG. 17, the upper surface of the STI 12 between memory cells is formed with a trench 12-1. The trench 12-1 is formed with intergate insulating film 15 and control gate electrode 16.

According to the first modification example, intergate insulating film 15 and control gate electrode 16 are formed between first parts 14-1 of neighboring floating gate electrodes 14 via STI 12. Therefore, this serves to further reduce a capacitance between neighboring cells.

According to the second modification example shown in FIG. 18, the upper surface of the STI 12 is formed with a projected portion 12-2. The projected portion 12-2 has a width narrower than the STI 12, and is formed thinner than the second part 14-2 of the floating gate electrode 14. In other words, the projected portion 12-2 has a height lower than the second part 14-2. The upper surface of the projected portion 12-2 is formed with intergate insulating film 15 and control gate electrode 16.

According to the second modification example, the upper surface of the STI 12 positions below the bottom surface of the second part 14-2. Therefore, a distance between the active area AA of the memory cell and the control gate electrode 16 is widened. Thus, this serves to improve breakdown voltage.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A non-volatile semiconductor memory device comprising:
   an isolation region formed in a semiconductor substrate, and composed of plural trenches and an isolation insulating film formed in the trench, wherein an upper surface of the isolation region is higher than the surface of the semiconductor substrate and a side surface of the upper surface of the isolation region is perpendicular to the surface of the semiconductor substrate;
   a gate insulating film formed on the semiconductor substrate between the isolation regions;
   a first gate electrode formed on the gate insulating film;
   an intergate insulating film formed on the first gate electrode; and
   a second gate electrode formed on the intergate insulating film,
   the first gate electrode including: a first part positioned between the isolation insulating films; a second part positioned on the first part and having a partial portion positioned on the isolation region; and a third part positioned on a central portion of the second part,
   wherein a width of the third part is set narrower than that of the second part and
   a central portion of the third part is positioned on a central portion of the second part.

2. The device according to claim 1, wherein the relationship between widths W1 and W3 of the first and third part is W3<W1.

3. The device according to claim 1, wherein the thickness of the second part is substantially equal to that of the third part.

4. The device according to claim 1, wherein a thickness of the intergate insulating film formed on both sides of the third part added to the width of the third part is less than the width of the second part.

5. The device according to claim 1, wherein an upper surface of the isolation region has a trench in which the intergate insulating film and the second gate electrode are formed.

6. The device according to claim 5, wherein the integrate insulating film and the second gate electrode are formed between adjacent first parts of the first gate electrodes between which the isolation region is formed.

7. The device according to claim 1, wherein an upper surface of the isolation region has a projected portion, a width of the projected portion is narrower than an upper surface of the isolation insulating film, and an upper surface of the projected portion is lower than an upper surface of the second part.

8. The device according to claim 7, wherein a back surface of the second gate electrode above the upper surface of the projected portion is lower than a back surface of the second gate electrode corresponding to a region except the projected portion.

9. The device according to claim 1, further comprising:
   a source/drain region formed in the semiconductor substrate positioned on both sides of the first gate electrode.

10. The device according to claim 9, wherein the first gate electrode, the intergate insulating film and the second gate electrode form a NAND flash memory.

* * * * *